United States Patent
Sawkar et al.

(10) Patent No.: US 7,171,634 B2
(45) Date of Patent: Jan. 30, 2007

(54) PROCESSING AND VERIFYING RETIMED SEQUENTIAL ELEMENTS IN A CIRCUIT DESIGN

(75) Inventors: Prashant S. Sawkar, Portland, OR (US); Bala K. Iyer, Hillsboro, OR (US); Silvian Goldenberg, Beaverton, OR (US); Prashant Saxena, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 193 days.

(21) Appl. No.: 10/879,781

(22) Filed: Jun. 28, 2004

(65) Prior Publication Data

US 2005/0289498 A1 Dec. 29, 2005

(51) Int. Cl.
*G06F 17/50* (2006.01)
(52) U.S. Cl. .................. 716/2; 716/6; 716/18
(58) Field of Classification Search ............. 716/1, 716/2, 4, 6, 10, 18
See application file for complete search history.

(56) References Cited

U.S. PATENT DOCUMENTS

| | | | | |
|---|---|---|---|---|
| 2002/0116685 A1* | 8/2002 | van Ginneken | ............... | 716/1 |
| 2004/0225970 A1* | 11/2004 | Oktem | ............... | 716/1 |

OTHER PUBLICATIONS

Bischoff, G.P., K.S. Brace, S. Jain, & R. Razdan, "Formal Implementation Verification of the Bus Interface Unit for the Alpha 21264 Microprocessor", Proceedings of the 1997 International Conference on Computer Design, 1997.
Brain, M., "How Boolean Logic Works", [online], [retrieved on Apr. 27, 2004], retrieved from the Internet at <URL: http://computer.howstuffworks.com/boolean3.htm>.
Cabodi, G., S. Quer, & F. Somenzi, "Optimizing Sequential Verification by Retiming Transformations", Proceedings of the 37th ACM/IEEE Design Automation Conference, 2000, pp. 601-606.
Chang, Y. & K. Cheng, "Induction-based Gate-level Verification of Multipliers", Proceedings of the 2001 IEEE/ACM International Conference on Computer-aided Design, 2001, pp. 190-193.
Doulos, "Design Flow Using Verilog", [online], [retrieved on Apr. 26, 2004], retrieved from the Internet at <URL: http://www.doulos.com/knowhow/verilog_designers_guide/design_flow_using_verilog/>.
Eckl, K., J.C. Madre, P. Zepter, & C. Legl, "A Practical Approach to Multiple-Class Retiming", Proceedings of the 36th ACM/IEEE Design Automation Conference, 1999, pp. 237-242.
HDL PLANET, "Synthesis", [online], [retrieved on Apr. 27, 2004], retrieved from the Internet at <URL: http://hdlplanet.tripod.com/synthesis/synthesis.html>.
Huang, S., K. Cheng, & K. Chen, "On Verifying the Correctness of Retimed Circuits", Proceedings of the 6th Great Lakes Symposium on VLSI, 1996, pp. 277.
Khasidashvili, Z., J. Moondanos, & Z. Hanna, "TRANS: Efficient Sequential Verification of Loop-Free Circuits", Proceedings of the Seventh Annual IEEE International Workshop on High Level Design Validation and Test, 2002, pp. 115-120.

(Continued)

*Primary Examiner*—Thuan Do
(74) *Attorney, Agent, or Firm*—David W. Victor; Konrad Raynes & Victor, LLP

(57) ABSTRACT

Provided are a method, system, and program for processing and verifying circuit designs. A circuit design specification written in a hardware definition language is received and zero delay black box code is added to the circuit design specification to position the zero delay black boxes at sequential elements. A synthesis of the circuit design specification is performed to generate a retimed implementation of the circuit design specification. The black boxes are processed in the retimed implementation to verify the synthesis of the circuit design.

33 Claims, 5 Drawing Sheets

OTHER PUBLICATIONS

Mneimneh, M., & K. Sakallah, "REVERSE: Efficient Sequential Verification for Retiming", Proceedings of the International Workshop on Logic and Synthesis, 2003.

Ranjan, R.K., V. Singhal, F. Somenzi, & R.K. Brayton, "Using Combinational Verification for Sequential Circuits", Proceedings of the Conference on Design, Automation and Test in Europe, 1999. Article No. 32, pp. 1-9.

Rosenmann, A. & Z. Hanna, "Alignability Equivalence of Synchronous Sequential Circuits", Proceedings of the Seventh Annual IEEE International Workshop in High Level Design Validation and Test, 2002, pp. 111-114.

Shenoy, N. & R. Rudell, "Efficient Implementation of Retiming", Proceedings of the 1994 IEEE/ACM International Conference on Computer-aided Design, 1994, pp. 226-233.

Shenoy, N.V., K.J. Singh, R.K. Brayton, & A.L. Sangiovanni-Vincentelli, "On the Temporal Equivalence of Sequential Circuits", Proceedings of the 29th ACM/IEEE Conference on Design Automation, 1992, pp. 405-409.

Van Eijk, C.A.J., "Sequential Equivalence Checking without State Space Traversal", Proceedings of the Conference on Design, Automation and Test in Europe, 1998, pp. 618-623.

\* cited by examiner

Original Specification

Implementation after inserting black boxes, synthesis, and retiming

After forward retiming to black box 1

After forward retiming to black box 2

After forward retiming to black box 3

After forward retiming to black box 4

After retiming to black box 5

PROCESSING AND VERIFYING RETIMED SEQUENTIAL ELEMENTS IN A CIRCUIT DESIGN

BACKGROUND

A circuit designer may code a finite state machine implemented with elements, such as latches and flip-flops, in a Hardware Definition Language (HDL), such as the Very High Speed Integrated Circuits Hardware Definition Language (VHDL) (defined as IEEE Standard 1076/2002). The code defining the circuit design, also known as the design specification, may then be subject to register transfer level (RTL) synthesis and retiming to reposition latches and flip-flops to optimize the design while preserving the input-output behavior of the circuit defined in the HDL code. The synthesis of the HDL code translates the logical description of the circuit defined by the HDL code into a network of standard cells that satisfies a set of timing constraints. The synthesized result comprises a retimed implementation of a netlist of digital cells, having technology specific digital cells required for the design.

After the synthesis and optimization operation, a verification operation is performed to verify the original design specification with the retimed implementation, i.e., the netlist implementation. Certain verification processes, such as those based on reachability analysis, are computationally expensive, and the computational cost of verification increases as the number of sequential elements, e.g., flop-flops, latches, etc., in the design increases.

DETAILED DESCRIPTION

In the following description, reference is made to the accompanying drawings which form a part hereof and which illustrate several embodiments. It is understood that other embodiments may be utilized and structural and operational changes may be made without departing from the scope of the embodiments.

Figure 1:
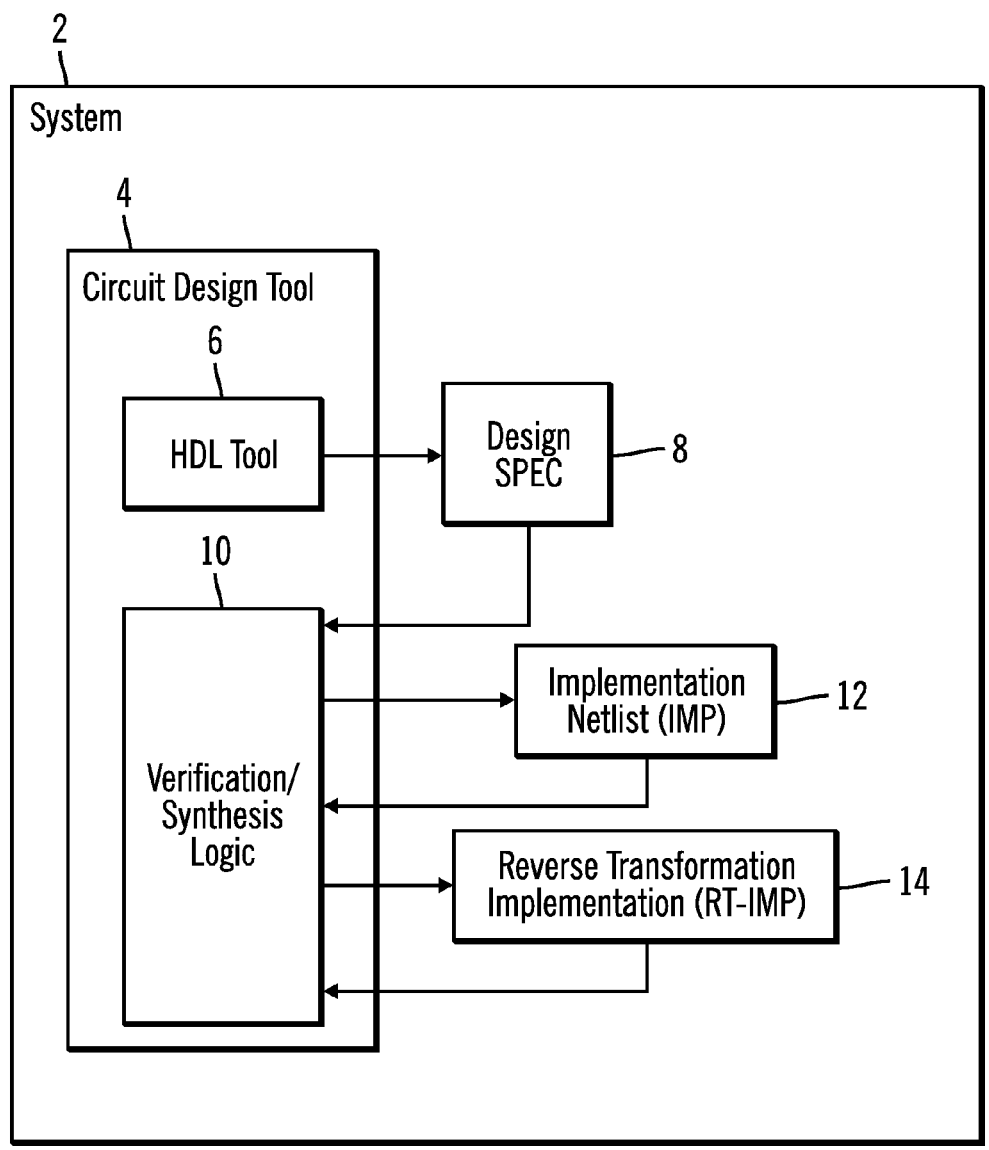
FIG. 1 illustrates a system including a circuit design tool.

FIG. 1 illustrates a computing environment in which embodiments are implemented. A system 2 comprises a computer system used by a developer of hardware circuits. A circuit design tool 4 comprises a suite of programs used by the circuit developer to code, optimize, and verify a circuit design. The circuit design tool 4 includes a hardware design language (HDL) tool 6 that is used to generate a circuit design specification (SPEC) 8 defining circuits, including sequential elements (e.g., latches, flip-flops, etc.) forming a finite state machine, which may be in an HDL, such as VHDL. In certain embodiments, the developer may code the circuits using a text editor program. The design SPEC 8 may then be inputted into verification/synthesis logic 10 to perform RTL or other types of synthesis to generate an implementation netlist (IMP) 12 including the technology specific digital cells to implement the design specified in the design SPEC 8. The synthesis operation may further perform retiming to move sequential elements to optimize performance and achieve a desired cycle time. The verification/synthesis logic 10 further receives as input the netlist IMP 12 and performs a reverse transformation of the netlist IMP 12 to generate a reverse implementation 14. The synthesis is verified if the reverse implementation 14 is equivalent to the design SPEC 8. The verification/synthesis logic 10 may use combination verification techniques, such as binary decision diagrams (BDDs) or others, to determine the equivalence between the reverse implementation 14 and the design SPEC 8. The verification synthesis logic 10 may be implemented in one or more programs.

Figure 2:
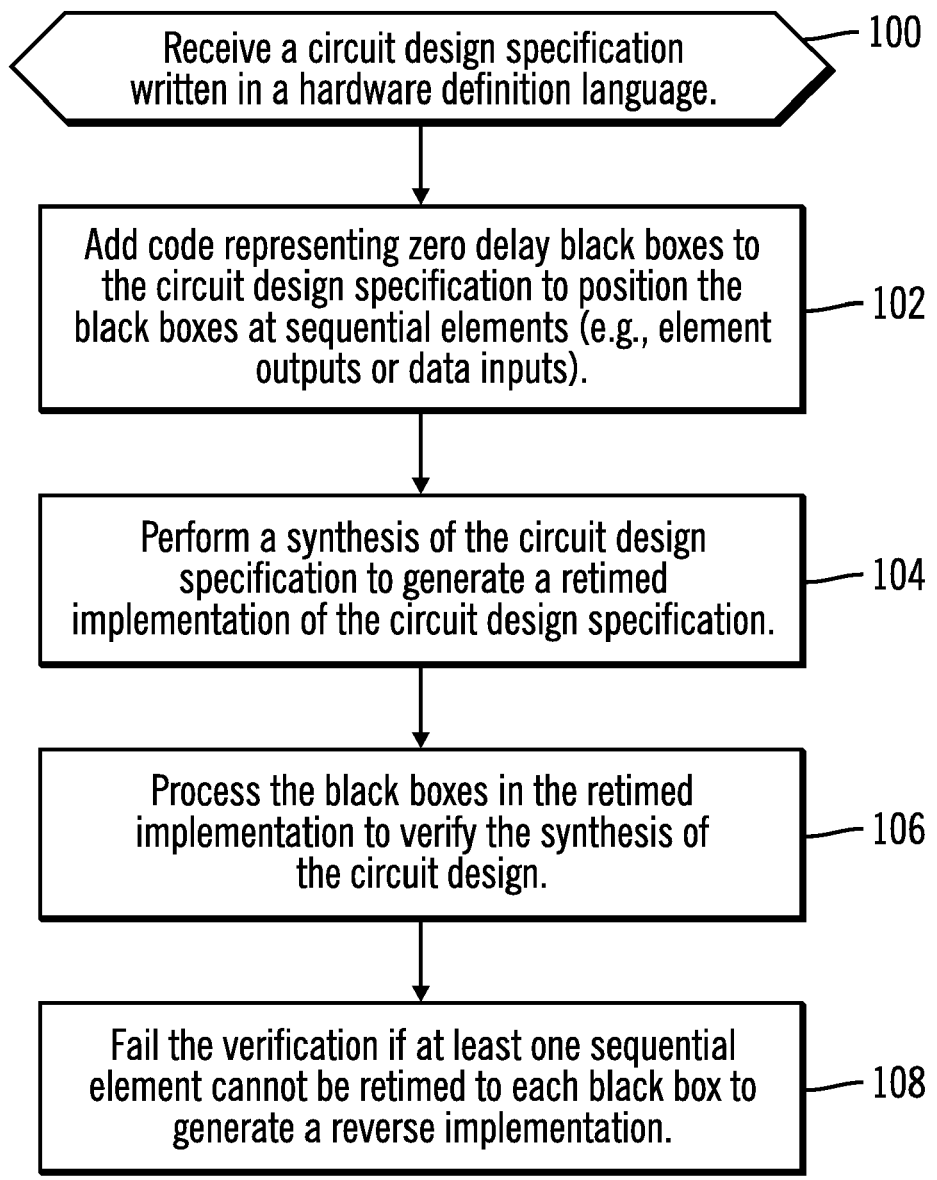
FIGS. 2 and 3 illustrate operations to optimize and verify a design including sequential elements.

FIG. 2 illustrates operations performed by the verification/synthesis logic 10 in one embodiment to retime and verify the design SPEC 8. Upon receiving (at block 100) a circuit design specification 8 written in a hardware definition language, the verification synthesis logic 10 adds (at block 102) code representing zero delay black boxes to the circuit design specification to position the black boxes at the outputs of sequential elements, such as flip-flops, latches, etc. In certain embodiments, the black boxes are added to the outputs of flip-flop circuits and mark the position of flip-flop circuits that are then retimed and moved as a result of the synthesis operation. The black boxes may have ideal pin/drive loading conditions and may not hinder the retiming transformations. The black boxes may include attributes such as clock, set, reset, enable, etc. of the original node they represent. A synthesis is performed (at block 104) of the circuit design specification 8 to generate a retimed implementation, e.g., 12, of the circuit design specification 8. The synthesis operation may involve a high level synthesis, logic synthesis, incremental retiming, and/or incremental logic synthesis. The synthesis operation may comprise any synthesis and retiming operation known in the art, such as RTL synthesis, to translate HDL code into an equivalent netlist of digital cells to improve the efficiency of the code, such as by minimizing the number of latches, etc. In certain embodiments, flip-flop circuits are retimed. Alternatively, sequential elements other than flip-flops, such as latches, may be subject to retiming. After synthesis and retiming, the verification synthesis logic 10 processes (at block 106) the black boxes in the retimed implementation, e.g., 14, to verify the synthesis and retiming of the circuit design. The verification is failed (at block 108), i.e., the netlist fails verification, if at least one sequential element cannot be retimed to each black box to generate a reverse implementation, e.g., 14.

Figure 3:
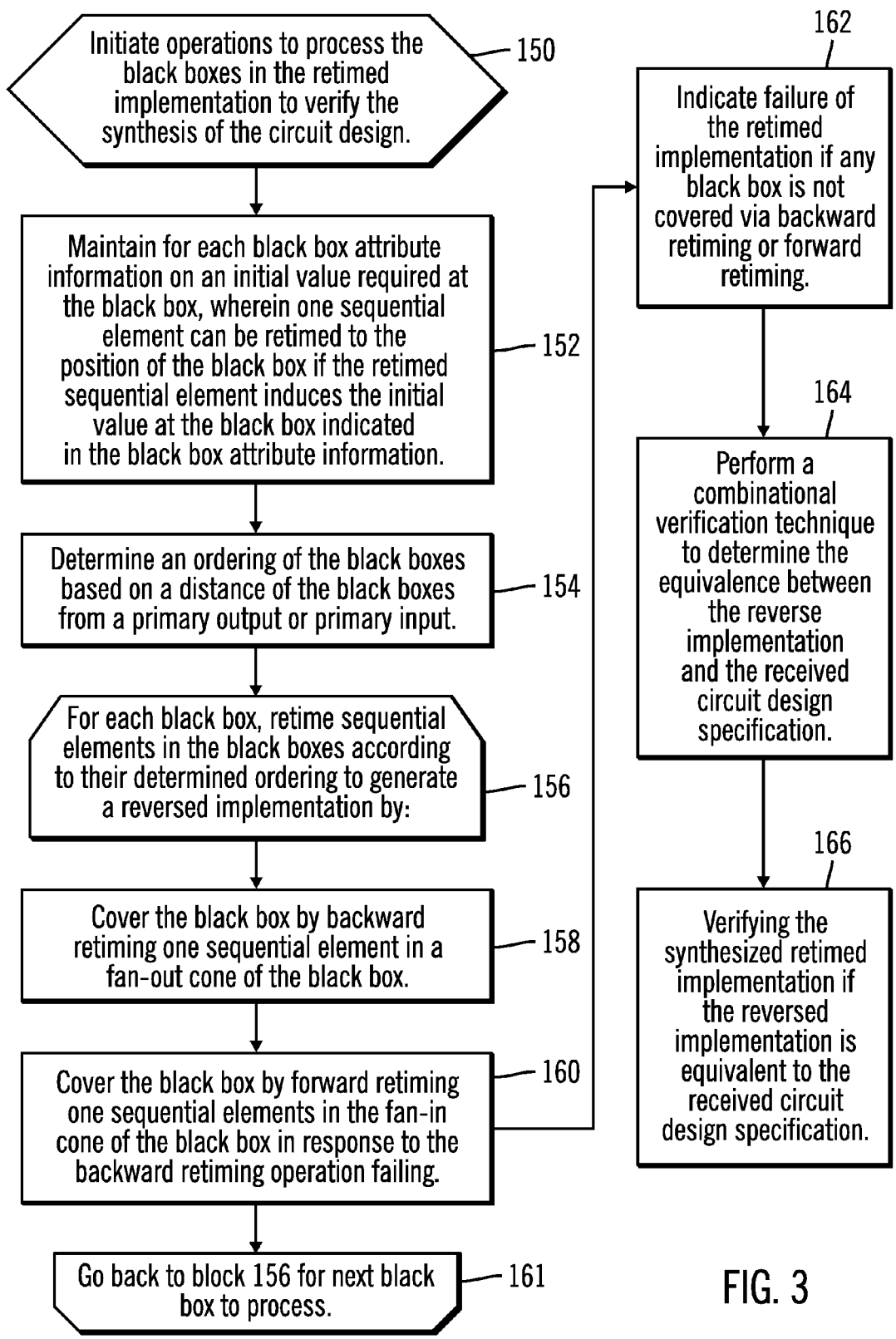

FIG. 3 illustrates an additional embodiment to perform the synthesis and verification operations on the retimed implementation (IMP) 12 having the black boxes marking the position of sequential elements that are moved as a result of the retiming operation, such as that performed at block 104 in FIG. 2. At block 150, operations are initiated to process the black boxes in the retimed implementation to verify the synthesis of the circuit design. The verification synthesis logic 10 maintains (at block 152) for each black box in the design specification 8 attribute information on an initial value required at the black box. For instance, the initial value may comprise zero for reset and one for set at the sequential elements that were located at the black box prior to retiming. In further embodiments, the black boxes maintain their position during the synthesis in the retimed implementation, e.g., 12, and the black boxes do not allow combinational logic on either of their sides to merge during the synthesis. Certain techniques may be used to minimize the extent to which the black boxes limit combinational restructuring optimizations where the combinational operations are clustered. Such techniques may include associating appropriate delay/input pin capacitances with black-boxes to mitigate the effects of fan-out re-powering that may be required during post pipeline scheduling; modifying the design SPEC 8 to position the flip-flops to allow relevant combinational operations to be adjacent; and adopting the synthesized/retimed netlist as a new design specification and then reapplying the synthesis.

The verification synthesis logic 10 determines (at block 154) an ordering of the black boxes in the retimed implementation, e.g., 12, based on a distance of the black boxes from a primary output or primary input, where the distance is determined by the maximum number of black boxes that exist between the black box currently being levelized and a primary output or input. The verification synthesis logic 10 performs a loop from blocks 156 through 161 to process each black box according to the determined ordering to generate a reverse implementation, e.g., RT-IMP 14, by retiming the sequential elements, e.g., flip-flops, to positions of the black boxes by performing the operations at 158 and 160 for each black box.

At block 158, the black box selected in block 156 is covered by backward retiming one sequential element in the fan-out cone of the black box. The backward retiming operation fails if the fan-out cone does not end with sequential elements on all the paths starting forward from the black-box. Once a sequential element is retimed to the location of the black box, the retimed element is locked in position and no longer participates in other retiming moves. In certain embodiments, the locked sequential element may be moved to cover a different black-box under the circumstance a replacement cover can be found. If a black box cannot be covered by using the backward retiming operation detailed in block 158, then the verification synthesis logic will cover (at block 160) the black box by forward retiming one sequential element in the fan-in cone of the black box in response to the backward retiming operation failing forward retiming of one sequential element in the fan-in cone of the black box chosen in block 156. The forward retiming operation will fail if the fan-in cone does not end with sequential elements on all the paths starting backwards from the black-box. In certain embodiments, the black box may contain an initial value attribute and this may require the backward retiming at block 158 to produce the same initial value as indicated on the black-box. This may be ascertained either by forward propagation of the initial values from the black box or by backward justification of the initial values on the sequential elements. Similarly when the forward retiming operation at block 160 is used to cover a black box which has an initial value, a determination may be made to ensure that the initial values of the sequential elements in the fan-in cone can provide a compatible initial value when retimed to the black box. This may be ascertained by a forward simulation or implication operation of the initial values of the sequential elements in the fan-in cone. If there are further black boxes to process (at block 161), then control returns to block 156; otherwise, control proceeds to block 162.

In certain embodiments, if forward retiming is used to reposition the sequential element to the black box location, then the sequential elements that are forward retimed should produce the same initial value as maintained with the black box. This may be ascertained by applying simulation on the sequential element outputs and propagating the results to the black-box. If backward retiming is used to move the sequential element to the black-box, then the sequential elements, e.g., flip-flops, that get backward retimed should also produce an initial value that was originally at the black-box, i.e., included with the black box attribute information. This may be ascertained via simulation of the values on the black box and propagating the results towards the flip-flops or via implication of the initial values on the flip-flops backwards towards the black-box and ascertaining that the implied value is consistent with what was originally recorded.

Failure of the retimed implementation is indicated (at block 162) if any black box is not covered via backward retiming (at block 158) or forward retiming (at block 160). If the reverse implementation is successfully generated, i.e., sequential elements are retimed to all the black boxes in the retimed implementation, then a combinational verification is performed (at block 164) to determine the equivalence between the reverse implementation, i.e., RT-IMP 14, and the received circuit design specification (SPEC) 8. Thus, if the reverse implementation (RT-IMP 14) and SPEC 18 are equivalent, then the retimed operation was successful. The synthesized retimed implementation is verified (at block 166) in response to determining that the reverse implementation, e.g., 14, is equivalent to the circuit design specification 8.

Figure 4A:
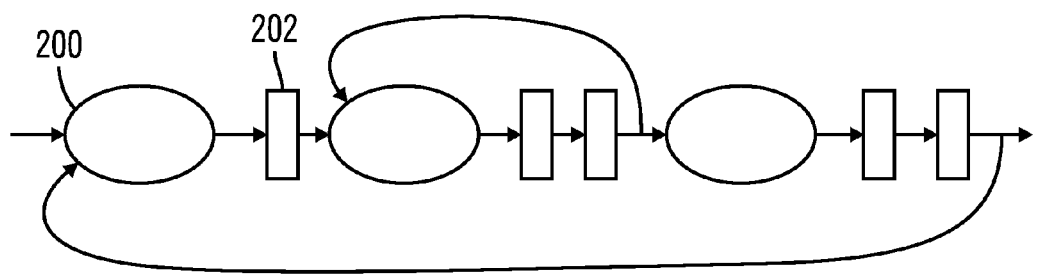
FIGS. 4a–4g illustrate a reverse retiming operation.
Figure 4B:
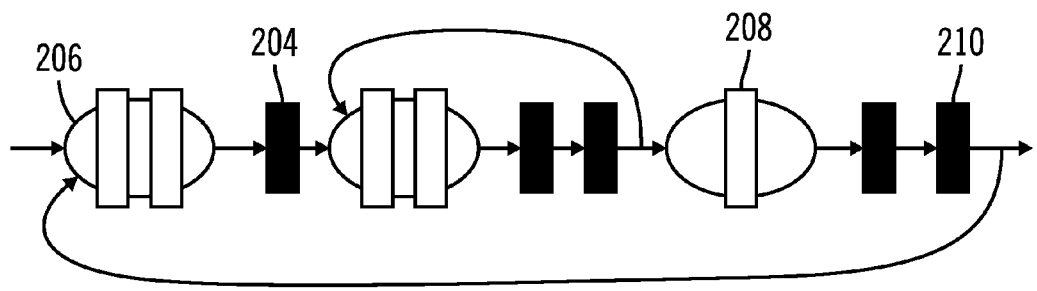
Figure 4C:
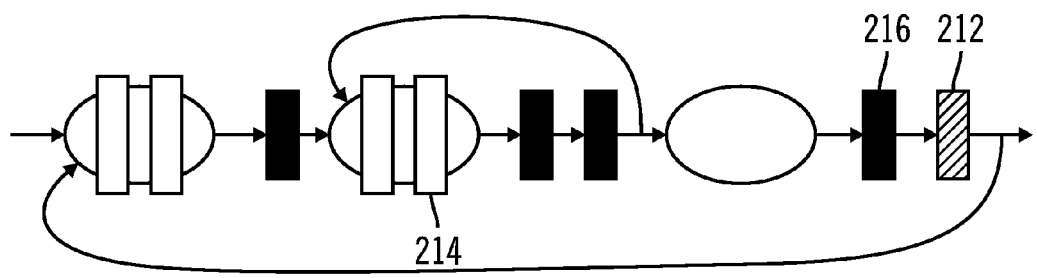
Figure 4D:
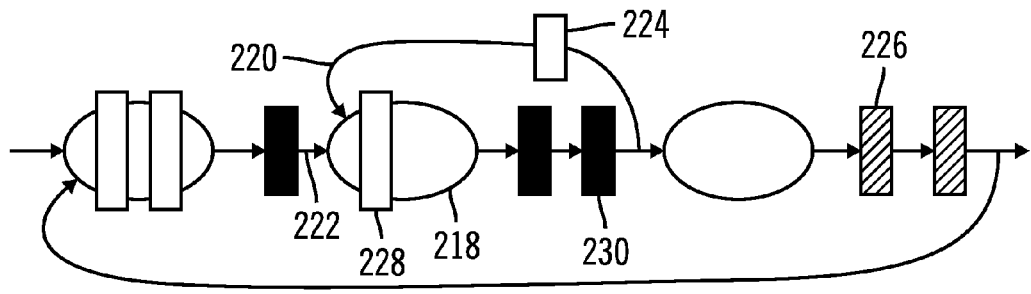
Figure 4E:
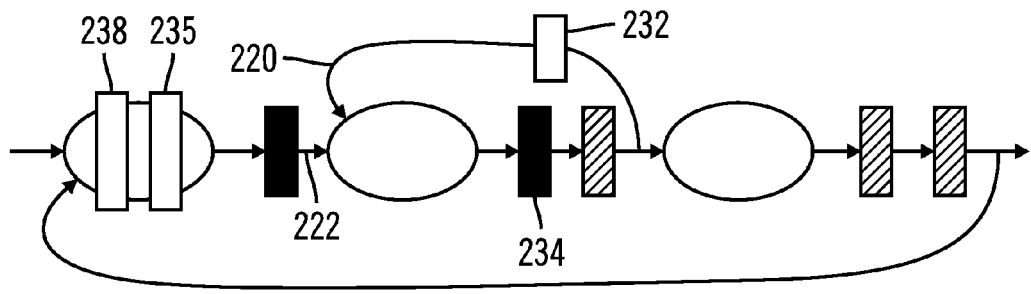
Figure 4F:
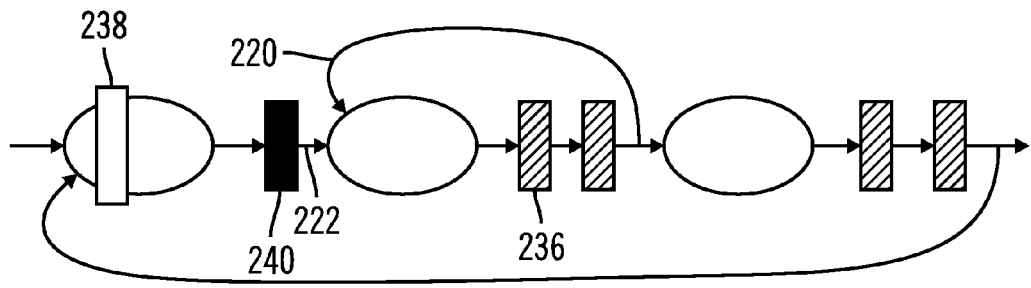
Figure 4G:
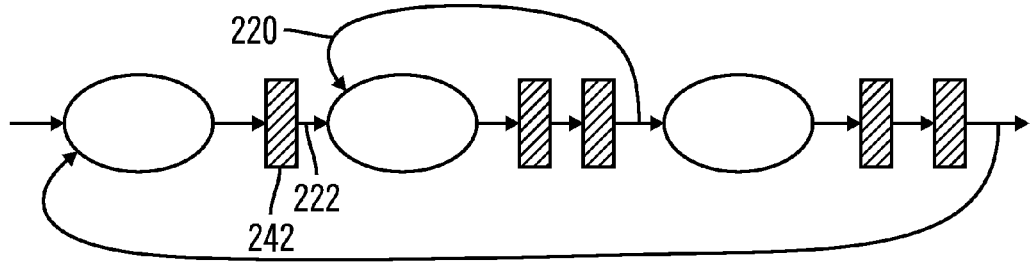

FIGS. 4a–4g illustrate an example of retiming flip-flops to black boxes to generate the reverse transformation implementation (RT-IMP) 14. FIG. 4a illustrates the original design specification (SPEC) 8, where the ovals, e.g., 200, represent combinational functions and the white boxes, e.g., 202, represent flip-flops. FIG. 4b illustrates the resulting implementation netlist (IMP) 12 after black boxes, e.g., 204, are added at the outputs of the flip-flops, and the flip-flops are retimed and moved within the combinational functions, e.g., 208. FIG. 4c illustrates the result of forward retiming the flip-flop 208 (FIG. 4b) to the first black box 210 (FIG. 4b), where the forward retimed flip-flop comprises the flip-flop 212 (FIG. 4c) at the location of black box 210 (FIG. 4b). FIG. 4d illustrates how the flip flop 214 (FIG. 4c) is forward retimed to the second black box 216 (FIG. 4c). The flip flop labeled 228 (FIG. 4d) is forward retimed next to cover the black-box 230 as shown in FIG. 4e. In order to cover the black box 234 in FIG. 4e, flip flop 232 is moved on arrow labeled 220 and also flip flop 235 on arrow labeled 222. This results in the black-box 234 (FIG. 4e) being covered by box 236 as shown in FIG. 4f. FIG. 4g illustrates the last forward retiming where flip-flop 238 (FIG. 4f) is retimed to the last black box 240 (FIG. 4f), as flip flop 242 (FIG. 4g).

Described embodiments provide techniques to verify a synthesis and retiming operation by adding black boxes to the design specification and then processing the black boxes in the retimed implementation. In certain embodiments, the processing of the black boxes in the retimed implementation involves reversing the retiming by retiming the sequential elements, e.g., flip-flops, backward or forward to the black boxes in the retimed implementation. The design is verified if the reverse implementation, where the flip-flops are retimed to the black boxes, is equivalent to the initial design specification.

ADDITIONAL EMBODIMENT DETAILS

The described embodiments may be implemented as a method, apparatus or article of manufacture using standard programming and/or engineering techniques to produce software, firmware, hardware, or any combination thereof. The term "article of manufacture" as used herein refers to code or logic implemented in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.). Code in the computer readable medium is accessed and executed by a processor. The code in which preferred embodiments are implemented may further be accessible through a transmission media or from a file server over a network. In such cases, the article of manufacture in which the code is implemented may comprise a transmission media, such as a network transmission line, wireless transmission media, signals propagating through space, radio waves, infrared signals, etc. Thus, the "article of manufacture" may comprise the medium in which the code is embodied. Additionally, the "article of manufacture" may comprise a combination of hardware and software components in which the code is embodied, processed, and executed. Of course, those skilled in the art will recognize that many modifications may be made to this configuration without departing from the scope of the embodiments, and that the article of manufacture may comprise any information bearing medium known in the art.

The described operations may be performed by circuitry, where "circuitry" refers to either hardware or software or a combination thereof. The circuitry for performing the operations of the described embodiments may comprise a hardware device, such as an integrated circuit chip, Programmable Gate Array (PGA), Application Specific Integrated Circuit (ASIC), etc. The circuitry may also comprise a processor component, such as an integrated circuit, and code in a computer readable medium, such as memory, wherein the code is executed by the processor to perform the operations of the described embodiments.

In certain embodiments, the black boxes are placed at the output of flip-flops and flip-flops are retimed during the synthesis operation. In alternative embodiments, the black boxes may be placed at the data inputs of the sequential elements, rather than the outputs. Further, the black boxes may be used to indicate the place of sequential elements other than flip-flops and the retiming may be performed with respect to sequential elements other than flip-flops, such as latches.

The described embodiments may be used to retime, synthesize and verify pipeline circuit designs or other types of circuit designs known in the art.

The described embodiments may be used to perform retiming for multiple clocks. In such embodiments, the black boxes may carry additional clocking information and the underlying inverse retiming algorithms will ensure that black-boxes are covered by retiming flops with compatible clocks.

The illustrated operations of FIGS. 2 and 3 show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to limit the embodiments to the precise form disclosed. Many modifications and variations are possible in light of the above teaching.

What is claimed is:

1. A method, comprising:
   receiving a circuit design specification written in a hardware definition language;
   adding code representing zero delay black boxes to the circuit design specification to position the black boxes at sequential elements;
   performing a synthesis of the circuit design specification to generate a retimed implementation of the circuit design specification, wherein the black boxes maintain their position during the synthesis in the retimed implementation and wherein the black boxes do not allow combinational logic in either of their sides to merge during the synthesis; and
   processing the black boxes in the retimed implementation to verify the synthesis of the circuit design.

2. The method of claim 1, wherein the black boxes are positioned at sequential element outputs or data inputs.

3. The method of claim 1, wherein processing the black boxes in the retimed implementation comprises:
   retiming sequential elements to reposition sequential elements to positions of the black boxes to generate a reversed implementation, wherein the retimed implementation is verified if the reversed implementation is equivalent to the received circuit design specification.

4. The method of claim 3, wherein retiming the sequential elements in the retimed implementation comprises:
   determining for each black box whether at least one sequential element can be retimed and positioned to the position of the black box; and
   indicating failure of the retimed implementation in response to determining that at least one sequential element cannot be retimed and positioned to the position of one black box.

5. The method of claim 4, further comprising:
   maintaining for each black box attribute information on an initial value required at the black box, wherein at least one sequential element can be retimed to the position of the black box if the retimed sequential elements induce the initial value at the black box indicated in the black box attribute information.

6. The method of claim 3, wherein retiming the sequential elements in the retimed implementation comprises:
   determining an ordering of the black boxes based on a distance of the black boxes from a primary output or primary input; and
   processing each black box according to the determined ordering to determine whether at least one sequential element can be retimed and moved to the position of the black box.

7. The method of claim 3, wherein retiming the sequential elements in the retimed implementation comprises performing for each black box:
   covering the black box by backward retiming one sequential element in a fan-out cone of the black box; and
   covering the black box by forward retiming one sequential element in the fan-in cone of the black box in response to the backward retiming operation failing.

8. The method of claim 7, wherein the determined forward or backward sequential element to retime to the position of the black box is a closest sequential element to the black box that can be retimed to the position of the black box.

9. The method of claim 3, wherein determining whether the reverse implementation is equivalent to the received circuit design specification comprises:

performing a combinational verification technique to determine the equivalence between the reversed implementation and the received circuit design specification.

10. The method of claim 1, wherein the retimed sequential elements comprise flip-flops and latches.

11. The method of claim 1, wherein the verification fails if one black box cannot be covered via retiming of the sequential elements.

12. A system, comprising:
circuitry enabled to:
(i) receive a circuit design specification written in a hardware definition language;
(ii) add code representing zero delay black boxes to the circuit design specification to position the black boxes at sequential elements;
(iii) perform a synthesis of the circuit design specification to generate a retimed implementation of the circuit design specification, wherein the black boxes maintain their position during the synthesis in the retimed implementation and wherein the black boxes do not allow combinational logic on either of their sides to merge during the synthesis; and
(iv) process the black boxes in the retimed implementation to verify the synthesis of the circuit design.

13. The system of claim 12, wherein the black boxes are positioned at sequential element outputs or data inputs.

14. The system of claim 12, wherein processing the black boxes in the retimed implementation comprises:
retiming sequential elements to reposition sequential elements to the black boxes to generate a reversed implementation, wherein the retimed implementation is verified if the reversed implementation is equivalent to the received circuit design specification.

15. The system of claim 14, wherein retiming the sequential elements in the retimed implementation comprises:
determining for each black box whether at least one sequential element can be retimed and positioned to the position of the black box; and
indicating failure of the retimed implementation in response to determining that no sequential element can be retimed and positioned to the position of one black box.

16. The system of claim 15, wherein the circuitry is further enabled to:
maintain for each black box attribute information on an initial value required at the black box, wherein at least one sequential element can be retimed to the position of the black box if the retimed sequential element induces the initial value at the black box indicated in the black box attribute information.

17. The system of claim 14, wherein retiming the sequential elements in the retimed implementation comprises:
determining an ordering of the black boxes based on a distance of the black boxes from a primary output or primary input; and
processing each black box according to the determined ordering to determine whether at least one sequential element can be retimed and moved to the position of the black box.

18. The system of claim 14, wherein retiming the sequential elements in the retimed implementation comprises performing for each black box:
covering the black box by backward retiming one sequential element in a fan-out cone of the black box; and
covering the black box by forward retiming one sequential element in the fan-in cone of the black box in response to the backward retiming operation failing.

19. The system of claim 18, wherein the determined forward or backward sequential element to retime to cover the black box is a closest sequential element to the black box that can be retimed to the position of the black box.

20. The system of claim 14, wherein determining whether the reversed implementation is equivalent to the received sequential element design specification comprises:
performing a combinational verification technique to determine the equivalence between the reversed implementation and the received sequential element design specification.

21. The system of claim 12, wherein the retimed sequential elements comprise flip-flops and latches.

22. The system of claim 12, wherein the verification fails if one sequential element cannot be retimed to each black box to generate a reversed implementation.

23. An article of manufacture enabled to perform operations, the operations comprising:
receiving a circuit design specification written in a hardware definition language;
adding code representing zero delay black boxes to the circuit design specification to position the black boxes at sequential elements;
performing a synthesis of the circuit design specification to generate a retimed implementation of the circuit design specification, wherein the black boxes maintain their position during the synthesis in the retimed implementation and wherein the black boxes do not allow combinational logic on either of their sides to merge during the synthesis; and
processing the black boxes in the retimed implementation to verify the synthesis of the circuit design.

24. The article of manufacture of claim 23, wherein the black boxes are positioned at sequential element outputs or data inputs.

25. The article of manufacture of claim 23, wherein processing the black boxes in the retimed implementation comprises:
retiming sequential elements to reposition sequential elements to positions of the black boxes to generate a reversed implementation, wherein the retimed implementation is verified if the reversed implementation is equivalent to the received circuit design specification.

26. The article of manufacture of claim 25, wherein retiming the sequential elements in the retimed implementation comprises:
determining for each black box whether at least one sequential element can be retimed and positioned to the position of black box; and
indicating failure of the retimed implementation in response to determining that one sequential element cannot be retimed and positioned to the position of one black box.

27. The article of manufacture of claim 26, wherein the operations further comprise:
maintaining for each black box attribute information on an initial value required at the black box, wherein at least one sequential element can be retimed to the position of the black box if the retimed sequential element induces the initial value at the black box indicated in the black box attribute information.

28. The article of manufacture of claim 25, wherein retiming the sequential elements in the retimed implementation comprises:
determining an ordering of the black boxes based on a distance of the black boxes from a primary output or primary input; and processing each black box according to the determined ordering to determine whether at least one sequential element can be retimed and moved to the position of the black box.

29. The article of manufacture of claim 25, wherein retiming the sequential elements in the retimed implementation comprises performing for each black box:
  covering the black box by backward retiming one sequential element in a fan-out cone of the black box; and
  covering the black box by forward retiming one sequential element in the fan-in cone of the black box in response to the backward retiming operation failing.

30. The article of manufacture of claim 29, wherein the determined forward or backward circuit to retime to the position of the black box is a closest circuit to the black box that can be retimed to the position of the black box.

31. The article of manufacture of claim 25, wherein determining whether the reversed implementation is equivalent to the received circuit design specification comprises:
  performing a combinational verification technique to determine the equivalence between the reversed implementation and the received circuit design specification.

32. The article of manufacture of claim 23, wherein the retimed circuits comprise flip-flops.

33. The article of manufacture of claim 23, wherein the verification fails if at least one circuit cannot be retimed to each black box to generate a reverse implementation.

\* \* \* \* \*

UNITED STATES PATENT AND TRADEMARK OFFICE
CERTIFICATE OF CORRECTION

| | |
|---|---|
| PATENT NO. | : 7,171,634 B2 |
| APPLICATION NO. | : 10/879781 |
| DATED | : January 30, 2007 |
| INVENTOR(S) | : Prashant S. Sawkar et al. |

It is certified that error appears in the above-identified patent and that said Letters Patent is hereby corrected as shown below:

Column 6, Line 13, delete "logic in" and replace with --logic on--.

Signed and Sealed this

Twenty-ninth Day of September, 2009

David J. Kappos
*Director of the United States Patent and Trademark Office*